(12) United States Patent  
Zhang

(10) Patent No.: US 10,651,383 B2  
(45) Date of Patent: May 12, 2020

(54) FLOW DEFLECTOR, INKJET PRINTING METHOD, INKJET PRINTING DEVICE, AND METHOD FOR MANUFACTURING DISPLAY SUBSTRATE

(71) Applicants: BEIJING BOE DISPLAY TECHNOLOGY CO., LTD., Beijing (CN); BOE TECHNOLOGY GROUP CO., LTD., Beijing (CN)

(72) Inventor: Di Zhang, Beijing (CN)

(73) Assignees: BEJING BOE DISPLAY TECHNOLOGY CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/159,906

(22) Filed: Oct. 15, 2018

(65) Prior Publication Data

US 2019/0245143 A1    Aug. 8, 2019

(30) Foreign Application Priority Data

Feb. 6, 2018  (CN) .......................... 2018 1 0116439

(51) Int. Cl.
*H01L 51/00* (2006.01)
*H01L 27/32* (2006.01)
(Continued)

(52) U.S. Cl.
CPC ............ *H01L 51/0005* (2013.01); *B41J 2/12* (2013.01); *B41J 2/1433* (2013.01); *H01L 27/3241* (2013.01); *H01L 51/5012* (2013.01)

(58) Field of Classification Search
CPC .... B41J 2/1433; B41J 2/14209; B41J 2/1609; B41J 2/162; B41J 2/1623; B41J 2/04526; B41J 2/1404; B41J 2002/14475
See application file for complete search history.

(56) References Cited

U.S. PATENT DOCUMENTS 6,347,859 B1    2/2002  Kawakami et al.
6,527,370 B1 *  5/2003  Courian et al. ................. 347/47
(Continued)

FOREIGN PATENT DOCUMENTS

CN    1387480 A    12/2002
CN    101168325 A   4/2008
(Continued)

OTHER PUBLICATIONS

First Office Action for Chinese Application No. 201810116439.9, dated Jun. 20, 2019, 9 Pages.
(Continued)

*Primary Examiner* — Juanita D Jackson
(74) *Attorney, Agent, or Firm* — Brooks Kushman P.C.

(57) ABSTRACT

A flow deflector, an inkjet printing method, an inkjet printing device, and a method for manufacturing a display substrate are provided. The flow deflector includes a plate-shaped body, and the plate-shaped body includes a first surface and a second surface opposite to each other, a plurality of through holes is arranged in the plate-shaped body, each of the plurality of through holes penetrates from the first surface to the second surface, and comprises a first opening formed on the first surface and a second opening formed on the second surface, and an opening area of the first opening is larger than an opening area of the second opening.

9 Claims, 2 Drawing Sheets

(51) Int. Cl.
*B41J 2/12* (2006.01)
*B41J 2/14* (2006.01)
*H01L 51/50* (2006.01)

(56) References Cited

U.S. PATENT DOCUMENTS

2012/0038705 A1\* 2/2012 Madigan et al. ............... 347/20
2012/0120150 A1 5/2012 Ando

FOREIGN PATENT DOCUMENTS

| | | |
|---|---|---|
| CN | 102529406 A | 7/2012 |
| CN | 107331681 A | 11/2017 |
| JP | 2008049481 A | 3/2008 |

OTHER PUBLICATIONS

1st Chinese Office Action, English Translation.
CN102529406A, English Abstract and U.S. Equivalent U.S. Pub. No. 2012/0120150.
CN1387480A, English Abstract and U.S. Equivalent U.S. Pat. No. 6,527,370.
CN101168325A, English Abstract and Machine Translation.
CN107331681A, English Abstract and Machine Translation.
JP2008049481A, English Abstract and Machine Translation.

\* cited by examiner

FLOW DEFLECTOR, INKJET PRINTING METHOD, INKJET PRINTING DEVICE, AND METHOD FOR MANUFACTURING DISPLAY SUBSTRATE

CROSS-REFERENCE TO RELATED APPLICATION

This application claims priority to Chinese Patent Application No. 201810116439.9 filed on Feb. 6, 2018, which is incorporated herein by reference in its entirety.

TECHNICAL FIELD

The present disclosure relates to the field of display technologies, and in particular, to a flow deflector, an inkjet printing method, an inkjet printing device, and a method for manufacturing a display substrate.

BACKGROUND

Organic Light-Emitting Diode (OLED) displays are called next-generation display technologies because of their advantages of self-luminescence, wide viewing angle, flexibility, and so on. In a manufacturing process of the OLED displays, an organic light-emitting layer is usually formed by using an inkjet printing process. In the inkjet printing process, when droplets are dripped, each of the droplets dripped by different print heads need to be aligned with a respective one of pixels. Positioning accuracy of the droplets is currently a main technical bottleneck, and a slight deviation in the positioning of the droplets can lead to errors in an entire printing plate. As resolution of products increases and pixel size decreases, the positioning accuracy of the droplets is also higher. Therefore, printing errors caused by poor positioning are more frequent.

SUMMARY

An object of the present disclosure is to provide a flow deflector, an inkjet printing method, an inkjet printing device, and a method for manufacturing a display substrate.

The technical solutions provided by the present disclosure are as follows.

In one aspect, the present disclosure provides, in some embodiments, a flow deflector comprising a plate-shaped body, wherein the plate-shaped body comprises a first surface and a second surface opposite to each other, a plurality of through holes is arranged in the plate-shaped body, each of the plurality of through holes penetrates from the first surface to the second surface, and comprises a first opening formed on the first surface and a second opening formed on the second surface, and an opening area of the first opening is larger than an opening area of the second opening.

Further, the plurality of through holes in the plate-shaped body is arranged in an array.

Further, a distance between the second openings of adjacent two of the through holes in a row direction is a first distance, a distance between the second openings of the adjacent two of the through holes in a column direction is a second distance, and the first distance is equal to the second distance.

Further, a center of the first opening of each of the plurality of through holes coincides with a center of the second opening of each of the plurality of through holes in a direction perpendicular to the plate-shaped body.

Further, each of the plurality of through holes is of a stepwise shape and comprises a first portion and a second portion.

The first portion is located on a side of the first surface, and the first opening is formed at an end of the first portion distal to the second surface; the second portion is located on a side of the second surface, and the second opening is formed at an end of the second portion distal to the first surface; and each of inner diameters of the first portion is larger than each of inner diameters of the second portion, and a step-shaped structure is formed at a junction of the first portion and the second portion.

Further, the first portion comprises a first end where the first opening is formed and a second end opposite to the first end, and the inner diameters of the first portion decrease gradually from the first end to the second end.

Further, the first portion is of a pyramidal frustum shape or a truncated cone shape.

Further, the second portion comprises a third end where the second opening is formed and a fourth end opposite to the third end, and the inner diameter of the second portion is uniform from the third end to the fourth end.

Further, a shape of the second opening comprises a circle.

In another aspect, the present disclosure, in some embodiments, provides an inkjet printing device comprising: a supporting platform configured to support a substrate to be processed, wherein the substrate is provided with a plurality of regions in which the ink is to be dripped; a plurality of nozzles for ejecting the ink, the plurality of nozzles being arranged above the supporting platform; and the above flow deflector. The first surface of the flow deflector is oriented toward the plurality of nozzles, the second surface of the flow deflector is oriented toward the supporting platform, the second opening of each of the plurality of through holes is arranged opposite to a respective one of the plurality of regions, and each of the plurality of nozzles is arranged opposite to the first opening of a respective one of the plurality of through holes.

In another aspect, the present disclosure provides in some embodiments an inkjet printing method for forming a predetermined film layer on a substrate to be processed through the inkjet printing device as described above, comprising: placing the substrate onto the supporting platform, the substrate being provided with a plurality of regions in which the ink is to be dripped; arranging the flow deflector above the substrate, the first surface of the flow deflector being oriented toward the plurality of nozzles, the second surface of the flow deflector being oriented toward the supporting platform, and the second opening of each of the plurality of through holes being arranged opposite to a respective one of the plurality of regions; arranging the plurality of nozzles above the flow deflector, each of the plurality of nozzles being arranged opposite to the first opening of a respective one of the plurality of through holes; injecting ink into the first opening of each of the plurality of through holes on the flow deflector through a respective one of the plurality of nozzles, to enable the ink to be injected into the region opposite to the second opening of each of the plurality of through holes through the second opening, thereby to form the predetermined film layer.

In yet another aspect, the present disclosure provides in some embodiments a method for manufacturing an OLED display substrate, the OLED display substrate comprising a plurality of pixel regions and an organic light-emitting layer formed in the plurality of pixel regions; wherein the organic light-emitting layer is formed through the above method, wherein the plurality of regions are the plurality of pixel regions, and the predetermined film layer is the organic light-emitting layer.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

In view of a technical problem of printing errors caused by inaccurate positioning of droplets during inkjet printing in the related art, the present disclosure provides a flow deflector, an inkjet printing method, an inkjet printing device, and a method for manufacturing a display substrate, which can ensure inkjet printing accuracy and improve printing accuracy.

Figure 1:
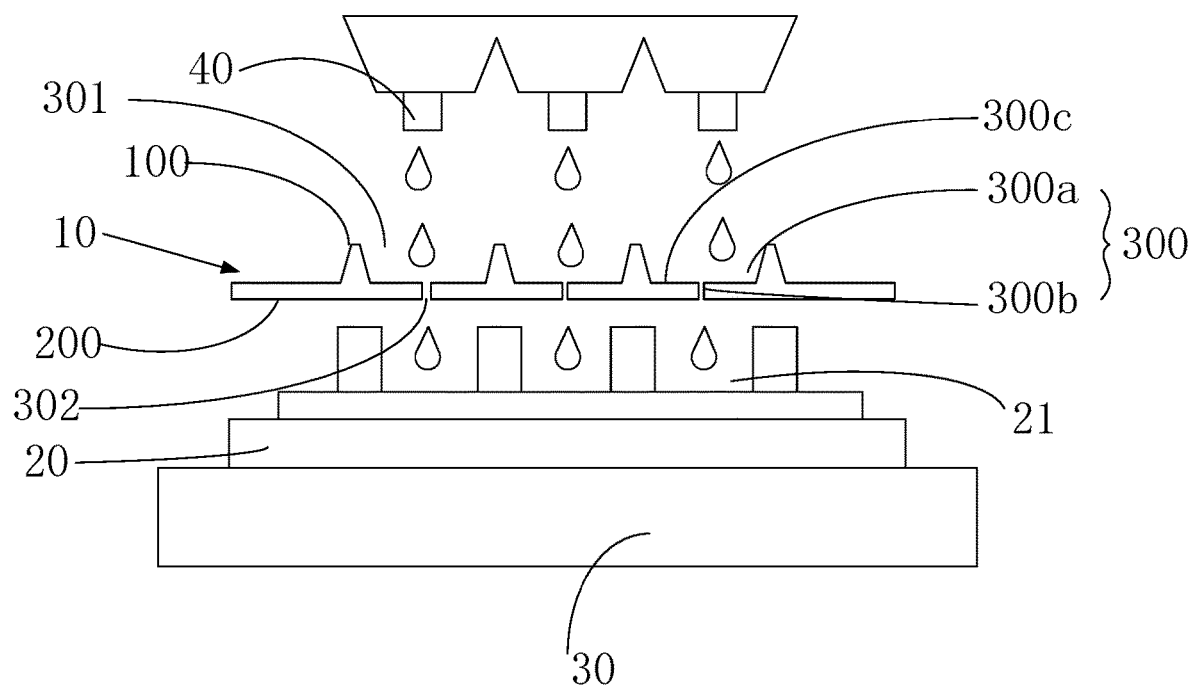
FIG. 1 is a schematic view showing a structure of an inkjet printing device provided in the embodiments of the present disclosure.

As shown in FIG. 1, a flow deflector 10 provided by the embodiments of the present disclosure includes a plate-shaped body including a first surface 100 and a second surface 200 opposite to each other. A plurality of through holes 300 is arranged in the plate-shaped body, each of the through holes 300 penetrates from the first surface 100 to the second surface 200, and includes a first opening 301 formed on the first surface 100 and a second opening 302 formed on the second surface 200, and an opening area of the first opening 301 is larger than an opening area of the second opening 302.

The flow deflector 10 provided in the above solution can be applied to the inkjet printing device, and it prints on a substrate 20 to be processed to form a predetermined film layer, wherein a plurality of regions 21 regions in which the ink is to be dripped are provided on the substrate 20. When inkjet printing is performed, each of the droplets needs to be accurately dripped into a respective one of the regions 21. When the flow deflector 10 provided by the embodiments of the present disclosure is used for inkjet printing, the flow deflector 10 is only required to be positioned so that the second openings 302 of the plurality of through holes 300 arranged thereon are aligned with the respective regions 21 on the substrate 20, the opening area of the first opening 301 of each of the through holes 300 is larger than the opening area of the second opening 302 of each of the through holes 300, so that the through holes 300 in the flow deflector 10 can function like funnels. Thus, as long as the droplets ejected from nozzles of the inkjet printing device fall within opening ranges of the respective first openings 301 of the through holes 300, it can ensure that the droplets can be correctly dripped into the corresponding regions 21, that is, a margin of error is provided for positioning accuracy of the nozzles. As long as positioning errors of the nozzles are within a certain range (not exceeding the opening range of the first opening 301), printing accuracy can be ensured, printing errors of the entire substrate 20 due to errors in the positioning accuracy of the nozzles can be avoided, and the printing accuracy is improved under the premise of ensuring low cost.

It should be noted that the flow deflector 10 provided by the embodiments of the present disclosure can be applied to a process of printing on various substrates 20 to form the predetermined film layer. In order to more clearly illustrate the present disclosure, the present disclosure will be described in more detail below by taking manufacturing process of an OLED display substrate as an example. A plurality of pixel regions is provided on the OLED display substrate. When an organic light-emitting layer of the OLED display substrate is to be formed, a plurality of pixel grooves are formed on the substrate 20 to be processed, a respective region corresponding to each of the pixel grooves is a pixel region, and then ink droplets of different colors are dripped into the respective pixel regions to form the organic light-emitting layer. The pixel regions are the regions 21 in which the ink is to be dripped.

When the flow deflector 10 provided by the embodiments of the present disclosure is used for inkjet printing the organic light-emitting layer of the OLED display substrate, the flow deflector 10 is positioned so that the second opening 302 of each of the through holes 300 arranged thereon is aligned with a respective one of the pixel grooves on the substrate 20 to be processed, the opening area of the first opening 301 of each of the through holes 300 is larger than the opening area of the second opening 302 of each of the through holes 300, so that the through holes 300 in the flow deflector 10 can function like funnels. Thus, as long as the droplets ejected from nozzles can fall within opening ranges of the respective first openings 301 of the through holes 300, it can ensure that each of the droplets can be correctly dripped into the a respective one of the pixel grooves. Thus, a margin of error of movement is provided for moving accuracy of the nozzles, as long as positioning errors of the droplets are within a certain range (not exceeding the opening range of the first opening 301), printing accuracy can be ensured, printing errors of the entire OLED display substrate due to errors in the moving accuracy of the nozzles are avoided, and the printing accuracy is improved under the premise of ensuring low cost.

In an alternative embodiment provided by the present disclosure, the plurality of through holes 300 in the plate-shaped body is arranged in an array.

Figure 2:
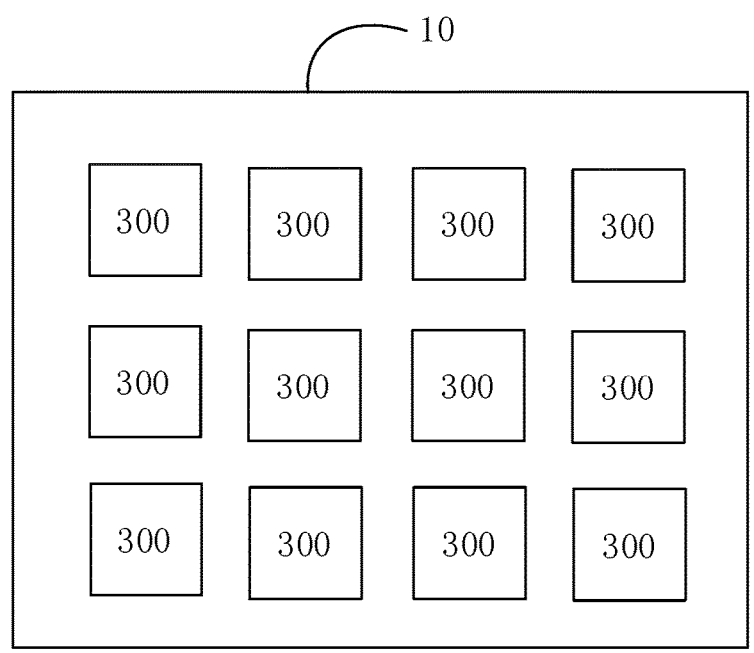
FIG. 2 is a schematic view showing through holes arranged in an array on a flow deflector provided in the embodiments of the present disclosure.

With the above solution, since the pixel regions of the OLED display substrate are arranged in an array, the plurality of through holes 300 in the flow deflector 10 are arranged in an array, as shown in FIG. 2, it can achieve the purpose of setting one-to-one correspondence with each pixel region. It should be noted that, in practical applications, the array arrangement of the through holes 300 is not limited to the specific array arrangement shown in FIG. 2, and other array arrangements may also be used; and when the flow deflector 10 is applied to an inkjet printing process of other products, the arrangement of the plurality of through holes 300 is not limited thereto, and other arrangements may be used, which will not be enumerated.

Figure 3:
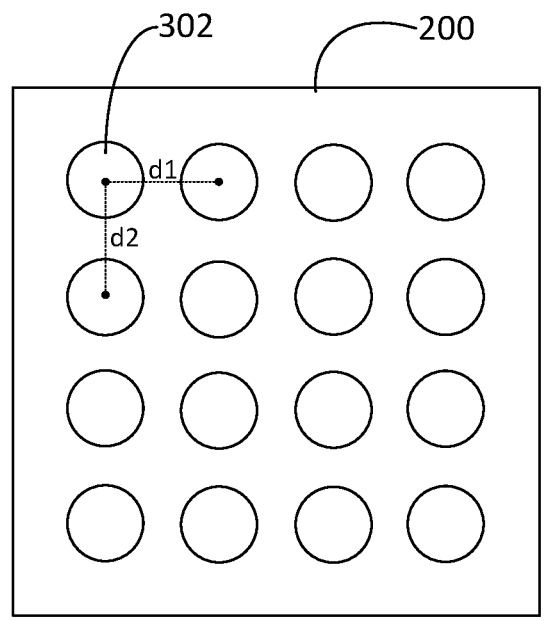
FIG. 3 is a bottom view of a flow deflector provided in the embodiments of the present disclosure.

In addition, in an alternative embodiment provided by the present disclosure, a distance between the second openings 302 of adjacent two of the through holes 300 in a row direction is a first distance d1, a distance between the second openings 302 of the adjacent two of the through holes 300 in a column direction is a second distance d2, and the first distance d1 is equal to the second distance d1, as shown in FIG. 3.

In the above solution, the plurality of through holes 300 arranged in the flow deflector 10 are evenly arranged, and the distance between the second openings 302 of any two adjacent through holes 300 in the row direction is equal to the distance between the second openings 302 of any other two adjacent through holes 300 in the row direction, which is equal to the first distance. In addition, the distance between the second openings 302 of any two adjacent through holes 300 in the column direction is also equal to the distance between the second openings 302 of any other two adjacent through holes 300 in the column direction, which is equal to the second distance. Optionally, the first distance is equal to the second distance. Thus, since the second opening 302 of each of the through holes 300 in the flow deflector 10 needs to be aligned with the pixel regions on the OLED display substrate, the plurality of through holes 300 in the flow deflector 10 are evenly arranged in the above manner to correspond exactly to the pixel regions on the OLED display substrate. It can be understood that, in practical applications, the arrangement of the plurality of through holes 300 in the flow deflector 10 is not limited thereto, and it can be reasonably designed according to the position of the regions 21 on the substrate 20 to be processed. For example, the first distance between the second openings 302 of the adjacent two through holes 300 in the row direction may also be greater or smaller than the second distance between the second openings 302 of the adjacent two through holes 300 in the column direction.

In addition, in the flow deflector 10 provided by the embodiments of the present disclosure, as shown in FIG. 1, a center of the first opening 301 of each of the through holes 300 coincides with a center of the second opening 302 of each of the through holes 300 in the direction perpendicular to the plate-shaped body.

With the above solution, the center of the first opening 301 of the through hole 300 coincides with the center of the second opening 302 of the through hole 300, which facilitates accurate alignment of the flow deflector 10. It can be understood that, in practical applications, the centers of the first opening 301 and the second opening 302 of the through hole 300 can also be adjusted according to actual needs.

In addition, in an alternative embodiment provided by the present disclosure, as shown in FIG. 1, each of the through holes 300 is of a stepwise shape and includes a first portion 300a and a second portion 300b, wherein the first portion 300a is located on a side of the first surface 100, and the first opening 301 is formed at an end of the first portion 300a distal to the second surface 200; the second portion 300b is located on a side of the second surface 200, and the second opening 302 is formed at an end of the second portion 300b distal to the first surface 100; and each of inner diameters of the first portion 300a is larger than each of inner diameters of the second portion 300b, and a step-shaped structure 300c is formed at a junction of the first portion 300a and the second portion 300b.

With the above solution, each of the through holes 300 is of a stepwise shape and the inner diameter of the first portion 300a of the through holes 300 is large, and the inner diameter of the second portion 300b is small. As a result, a structure 300c of a stepwise shape is formed between the first portion 300a and the second portion 300b, and it can function as a buffer for storing the ink. When the ink ejected from the nozzles enters the through holes 300, it is buffered and stored in the first portion 300a, which enables the uniformity of the amounts of ink dripped by the second openings 302 in the different through holes 300.

It can be understood that the specific shape of the through holes 300 is not limited to the stepped-wise shape, and it may be of any one of other structures as long as the opening area of the first opening 301 of the through hole 300 is larger than the opening area of the second opening 302 of the through hole 300. For example, the through hole 300 may be of a truncated cone shape whose inner diameter gradually decreases from the first opening 301 to the second opening 302, and it will not be enumerated herein.

Figure 4:
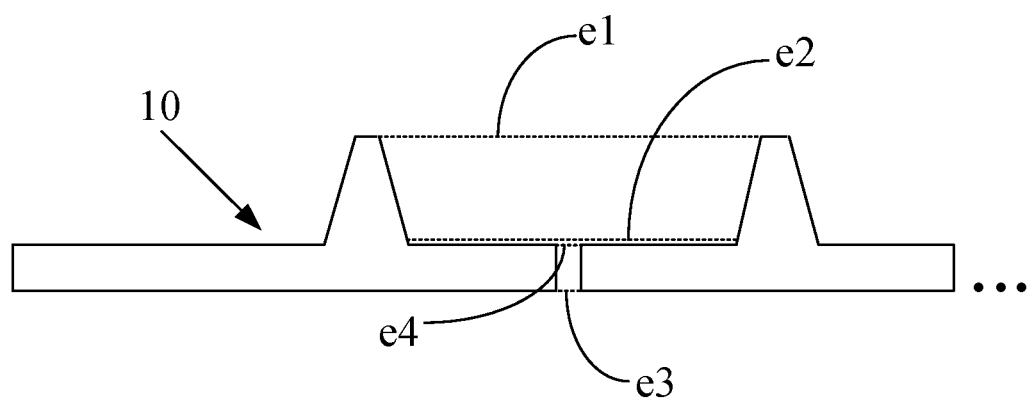
FIG. 4 is a schematic view showing a left portion of a flow deflector in FIG. 1.

In addition, in an alternative embodiment provided by the present disclosure, as shown in FIG. 1 and FIG. 4, the first portion 300a includes a first end e1 where the first opening 301 is formed and a second end e2 opposite to the first end e1, and the inner diameters of the first portion 300a decrease gradually from the first end e1 to the second end e2.

With the above solution, the inner diameters of the first portion 300a decrease gradually from the end e1 of the first opening 301 to the end e2 of the second opening 302. Thus, the inner wall of the first portion 300a can function as a drainage, so that the ink can smoothly flow to the second opening 302.

Optionally, as shown in FIG. 1, the first portion 300a is of a pyramidal frustum shape or a truncated cone shape. With the above solution, the first portion 300a may be selected as a structure of a pyramidal frustum shape or a truncated cone shape, which has a regular structure and may be manufactured in a simple process.

It should be noted that, in practical applications, the specific structure of the first portion 300a may not be limited thereto, and may be designed as other structures according to actual needs. For example, the first portion 300a may also be a columnar structure, and thus the inner diameter of the first portion 300a is uniform from the end of the first opening 301 to the end of the second opening 302.

In addition, in an alternative embodiment provided by the present disclosure, as shown in FIG. 1 and FIG. 4, the second portion 300b includes a third end e3 where the second opening 302 is formed and a fourth end e4 opposite to the third end e3, and the inner diameter of the second portion 300b is uniform from the third end e3 to the fourth end e4.

With the above solution, the second portion 300b is a columnar shape. Since the size of the pixel region is small, and the size of the second opening 302 is smaller, and is about several to several tens of microns. Therefore, for ease of manufacture, the second portion 300b may be of a columnar shape. In a practical application, the second portion 300b may be formed by directly forming a hole at the bottom of the first portion 300a.

Optionally, as shown in FIG. 3, the shape of the second opening 302 may be circular. In this way, it enables the ink to spread evenly after the ink is dripped into the regions 21 of the substrate 20. It can be understood that the shape of the second opening 302 can be designed according to actual needs.

In addition, it should be noted that, in the flow deflector 10 provided in the embodiments of the present disclosure, as long as the droplets ejected by the nozzles can fall into the opening range of the first opening 301 of the through holes 300, it is ensured that each of the liquid droplets can be correctly dripped into a respective one of the corresponding regions 21, and therefore, the size of the first opening 301 should be made as large as possible. In practical applications, optionally, the opening area of the first opening 301 is slightly larger than the size of the pixel regions on the OLED display substrate.

In addition, it should be noted that, in the flow deflector 10 provided by the embodiments of the present disclosure, since the flow deflector 10 is in contact with the ink, the material should be selected from a low surface energy material that does not adversely affect quality of the ink. For example, the flow deflector 10 can be made of a polytetrafluoroethylene material.

In addition, it should be noted that the flow deflector 10 provided by the embodiments of the present disclosure can form the through holes 300 thereon by means of a process such as a plasma etching process or laser etching process, which is easy to be implemented.

In addition, as shown in FIG. 1, an inkjet printing device is further provided in the embodiments of the present disclosure, including:

A supporting platform 30 configured to support a substrate 20 to be processed, wherein the substrate 20 is provided with a plurality of regions 21 in which the ink is to be dripped; a plurality of nozzles 40 for ejecting the ink, the plurality of nozzles 40 being arranged above the supporting platform 30; and the flow deflector 10 provided in the embodiments of the present disclosure. The first surface 100 of the flow deflector 10 is oriented toward the nozzles 40, and the second surface 200 of the flow deflector 10 is oriented toward the supporting platform 30, the second opening 302 of each of the through holes 300 is arranged opposite to a respective one of the regions 21, and each of the nozzles 40 is arranged above the first openings of the respective one of the through holes.

In the inkjet printing device provided by the embodiments of the present disclosure, a flow deflector 10 is arranged between the nozzles 40 and the supporting platform 30. When the inkjet printing is performed, the flow deflector 10 is positioned so that the second openings 302 of the plurality of through holes 300 arranged thereon are aligned with the regions 21 on the substrate 20. Due to the opening area of the first opening 301 of each of the through holes 300 is larger than the opening area of the second opening 302 of each of the through holes 300, the through holes 300 in the flow deflector 10 can function like funnels. Thus, as long as the droplets ejected from nozzles 40 can fall within opening ranges of the respective first openings 301 of the through hole 300, it can ensure that the droplets can be correctly dripped into the corresponding regions 21, that is, a margin of error is provided for positioning accuracy of the nozzles 40. As long as positioning errors of the nozzle 40 are within a certain range (not exceeding the size range of the first opening 301), printing accuracy can be ensured, printing errors of the entire substrate 20 due to errors in the positioning accuracy of the nozzles 40 can be avoided, and the printing accuracy is improved under the premise of ensuring low cost.

In addition, an inkjet printing method is further provided in the embodiments of the present disclosure for forming a predetermined film layer on a substrate 20 to be processed through the inkjet printing device described above, the method includes: placing the substrate 20 onto the supporting platform 30, the substrate 20 being provided with a plurality of regions 21 in which the ink is to be dripped; arranging the flow deflector 10 above the substrate 20, the first surface 100 of the flow deflector 10 being oriented toward the nozzles 40, the second surface 200 of the flow deflector 10 being oriented toward the supporting platform 30, and the second opening 302 of each of the through holes 300 being arranged opposite to a respective one of the regions 21; arranging the plurality of nozzles 40 above the first opening 301 of each of the through holes 300 in the flow deflector 10; injecting ink into the first opening 301 of each of the plurality of through holes 300 in the flow deflector 10 through the plurality of nozzles 40, so that the ink is injected into corresponding regions 21 through the second opening 302 of the through holes 300 to form the predetermined film layer.

In the inkjet printing device provided in the above solution, a flow deflector 10 is arranged between the nozzles 40 and the supporting platform 30. When the inkjet printing is performed, the flow deflector 10 is positioned so that the second openings 302 of the plurality of through holes 300 arranged thereon are aligned with the regions 21 on the substrate 20. Due to the opening area of the first opening 301 of each of the through holes 300 is larger than the opening area of the second opening 302 of each of the through holes 300, the through holes 300 in the flow deflector 10 can function like funnels. Thus, as long as the droplets ejected from nozzles 40 can fall within opening ranges of the respective first openings 301 of the through hole 300, it can ensure that the droplets can be correctly dripped into the corresponding regions 21, that is, a margin of error is provided for positioning accuracy of the nozzles 40. As long as positioning errors of the nozzle 40 are within a certain range (not exceeding the size range of the first opening 301), printing accuracy can be ensured, printing errors of the entire substrate 20 due to errors in the positioning accuracy of the nozzles 40 can be avoided, and the printing accuracy is improved under the premise of ensuring low cost.

It should be noted that the flow deflector 10 provided by the embodiments of the present disclosure can be applied to a process of printing on any one of various substrates 20 to form the predetermined film layer, wherein a plurality of regions 21 are provided on the substrate 20, and the ink needs to be accurately dripped into the corresponding regions 21.

Taking the manufacturing process of the OLED display substrate as an example, a plurality of pixel regions is provided on the OLED display substrate. When an organic light-emitting layer of the OLED display substrate is to be formed, a plurality of pixel grooves are formed on the substrate 20 to be processed, a respective region corresponding to each of the pixel grooves is a pixel region, and then ink droplets of different colors are dripped into the respective pixel regions to form the organic light-emitting layer. The pixel regions are the regions 21 in which the ink is to be dripped.

In addition, the embodiments of the present disclosure further provides a method for manufacturing an OLED display substrate, the OLED display substrate including a plurality of pixel regions and an organic light-emitting layer formed in the plurality of pixel regions. The organic light-emitting layer is formed through the inkjet printing method described above, wherein the regions 21 are the pixel regions, and the predetermined film layer is the organic light-emitting layer.

In addition, in the embodiments of the present disclosure, it further provides an OLED display substrate manufactured by the method for manufacturing the OLED display substrate in the embodiments of the present disclosure.

In the embodiments of the present disclosure, it further provides a display device including an OLED display substrate in the embodiments of the present disclosure.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An inkjet printing device, comprising:
   a supporting platform configured to support a substrate to be processed, wherein the substrate is provided with a plurality of regions in which the ink is to be dripped;
   a plurality of nozzles for ejecting the ink, the plurality of nozzles being arranged above the supporting platform; and
   a flow deflector, wherein the flow deflector comprises a plate-shaped body, the plate-shaped body comprises a first surface and a second surface opposite to each other, a plurality of through holes is arranged in the plate-shaped body, each of the plurality of through holes penetrates from the first surface to the second surface, and comprises a first opening formed on the first surface and a second opening formed on the second surface, and an opening area of the first opening is larger than an opening area of the second opening, the first surface of the flow deflector is oriented toward the plurality of nozzles, the second surface of the flow deflector is oriented toward the supporting platform, the second opening of each of the plurality of through holes is arranged opposite to a respective one of the plurality of regions, and each of the plurality of nozzles is arranged opposite to the first opening of a respective one of the plurality of through holes, and the nozzles are not physically connected to the flow deflector, and are configured to be movable relative to the flow deflector in a direction being parallel to the supporting platform.

2. The inkjet printing device according to claim 1, wherein
   the plurality of through holes in the plate-shaped body is arranged in an array.

3. The inkjet printing device according to claim 2, wherein
   a distance between the second openings of adjacent two of the through holes in a row direction is a first distance, a distance between the second openings of the adjacent two of the through holes in a column direction is a second distance, and the first distance is equal to the second distance.

4. The inkjet printing device according to claim 1, wherein
   a center of the first opening of each of the plurality of through holes coincides with a center of the second opening of the through hole in a direction perpendicular to the plate-shaped body.

5. The inkjet printing device according to claim 1, wherein
   each of the plurality of through holes is of a step shape and comprises a first portion and a second portion,
   wherein the first portion is located on a side of the first surface, and the first opening is formed at an end of the first portion distal to the second surface;
   the second portion is located on a side of the second surface, and the second opening is formed at an end of the second portion distal to the first surface; and
   each of inner diameters of the first portion is larger than an inner diameter of the second portion, and a step-shaped structure is formed at a junction of the first portion and the second portion.

6. The inkjet printing device according to claim 5, wherein
   the first portion comprises a first end where the first opening is formed and a second end opposite to the first end, and the inner diameters of the first portion decrease gradually from the first end to the second end.

7. The inkjet printing device according to claim 6, wherein
   the first portion is of a pyramidal frustum shape or a truncated cone shape.

8. The inkjet printing device according to claim 5, wherein
   the second portion comprises a third end where the second opening is formed and a fourth end opposite to the third end, and the inner diameter of the second portion is uniform from the third end to the fourth end.

9. The inkjet printing device according to claim 1, wherein
   a shape of the second opening comprises a circle.

* * * * *

UNITED STATES PATENT AND TRADEMARK OFFICE
CERTIFICATE OF CORRECTION

| | | |
|---|---|---|
| PATENT NO. | : 10,651,383 B2 | Page 1 of 1 |
| APPLICATION NO. | : 16/159906 | |
| DATED | : May 12, 2020 | |
| INVENTOR(S) | : Di Zhang | |

It is certified that error appears in the above-identified patent and that said Letters Patent is hereby corrected as shown below:

On the Title Page

Item (73) Delete:
"(73) Assignees: BEJING BOE DISPLAY TECHNOLOGY GROUP CO., LTD., Beijing (CN); BOE TECHNOLOGY GROUP CO., LTD., Beijing (CN)"

And Insert:
--(73) Assignees: BEIJING BOE DISPLAY TECHNOLOGY GROUP CO., LTD., Beijing (CN); BOE TECHNOLOGY GROUP CO., LTD., Beijing (CN)--.

Signed and Sealed this
Fifteenth Day of June, 2021

Drew Hirshfeld
*Performing the Functions and Duties of the*
*Under Secretary of Commerce for Intellectual Property and*
*Director of the United States Patent and Trademark Office*